United States Patent
Guo et al.

(10) Patent No.: US 11,621,719 B2
(45) Date of Patent: Apr. 4, 2023

(54) PRE-DRIVE MODULE OF ANALOG-TO-DIGITAL CONVERTER, AND ANALOG-TO-DIGITAL CONVERSION DEVICE

(71) Applicant: Radiawave Technologies Co., Ltd., Shenzhen (CN)

(72) Inventors: Xiaofeng Guo, Shenzhen (CN); Erkan Alpman, Portland, OR (US); Jon Sweat Duster, Beaverton, OR (US); Yulin Tan, Shenzhen (CN); Haigang Feng, Shenzhen (CN); Ning Zhang, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 57 days.

(21) Appl. No.: 17/508,642

(22) Filed: Oct. 22, 2021

(65) Prior Publication Data
US 2022/0045688 A1  Feb. 10, 2022

Related U.S. Application Data

(63) Continuation of application No. PCT/CN2020/085173, filed on Apr. 16, 2020.

(30) Foreign Application Priority Data

May 10, 2019  (CN) .......................... 201910392513.4

(51) Int. Cl.
*H03M 1/12*  (2006.01)
*H03M 1/18*  (2006.01)

(52) U.S. Cl.
CPC ........... *H03M 1/1245* (2013.01); *H03M 1/18* (2013.01)

(58) Field of Classification Search
CPC .................................................. H03M 1/1245
(Continued)

(56) References Cited

U.S. PATENT DOCUMENTS 7,365,664 B2 *  4/2008  Caduff .................. H03M 1/188
                                                            455/132
9,571,118 B1     2/2017  Gupta et al.
(Continued)

FOREIGN PATENT DOCUMENTS

CN      101820257 A      9/2010
CN      104300984 A      1/2015
(Continued)

OTHER PUBLICATIONS

First Office Action issued in counterpart Chinese Patent Application No. 201910392513.4, dated Apr. 1, 2021.
(Continued)

*Primary Examiner* — Peguy Jean Pierre
(74) *Attorney, Agent, or Firm* — Westbridge IP LLC

(57) ABSTRACT

Disclosed are a pre-drive module of an analog-to-digital converter and an analog-to-digital conversion device. The pre-drive module includes a sampling capacitor; a controller configured to output a reset control signal, a pre-sampling control signal, and a sampling control signal according to a preset timing sequence; a reset module configured to reset the sampling capacitor upon receiving the reset control signal; a first auxiliary drive circuit configured to amplify an input analog signal and output to the sampling capacitor for sampling upon receiving the sample control signal; and a second auxiliary drive circuit. The controller is configured to output the pre-sampling control signal before outputting the sampling control signal, control the second auxiliary drive circuit to amplify the input analog signal, and output to the sampling capacitor for pre-sampling, and when a charging (Continued)

voltage of the sampling capacitor during pre-sampling reaches a preset voltage value, output the sampling control signal.

10 Claims, 3 Drawing Sheets

(58) Field of Classification Search
USPC .......................................................... 341/155
See application file for complete search history.

(56) References Cited

U.S. PATENT DOCUMENTS

2008/0129570 A1    6/2008  Lim et al.
2015/0228355 A1    8/2015  Bogner

FOREIGN PATENT DOCUMENTS

| | | |
|---|---|---|
| CN | 106921392 A | 7/2017 |
| CN | 107332563 A | 11/2017 |
| CN | 108075777 A | 5/2018 |
| CN | 108206700 A | 6/2018 |
| CN | 110113052 A | 8/2019 |
| EP | 2650881 A1 | 10/2013 |
| KR | 20050088776 A | 9/2005 |

OTHER PUBLICATIONS

International Search Report and Written Opinion issued in corresponding PCT Application No. PCT/CN2020/085173, dated Jun. 30, 2020.

\* cited by examiner

PRE-DRIVE MODULE OF ANALOG-TO-DIGITAL CONVERTER, AND ANALOG-TO-DIGITAL CONVERSION DEVICE

CROSS-REFERENCE TO RELATED APPLICATIONS

This application is a continuation application of International Application No. PCT/CN2020/085173, filed on Apr. 16, 2020, which claims priority to Chinese Patent Application No. 201910392513.4, filed on May 10, 2019, the entire disclosure of which is incorporated herein by reference.

TECHNICAL FIELD

The present disclosure relates to the technical field of analog-to-digital conversion, and in particular to a pre-drive module of an analog-to-digital converter and an analog-to-digital conversion device.

BACKGROUND

For the product application of most analog-to-digital converters (ADC), the front end generally requires a programmable gain amplifier (PGA) or a low noise amplifier (LNA) to preprocess the input analog signal and drive the subsequent stage analog-to-digital converter for anti-aliasing filtering and/or signal amplification. The back end requires a digital signal processing (DSP) module, and the three together form a complete system.

For the product field of non-low-speed (sampling rate is greater than 10 MHz) high-precision analog-to-digital converters, successive approximation analog-to-digital converters (SAR ADC) are the most commonly used structure. Even in the field of ultra-high-precision analog-to-digital converters (effective number of bits is greater than 16 bits), successive approximation analog-to-digital converters have gradually replaced high-precision analog-to-digital converters (sigma-delta ADC) in recent years and become the mainstream structure. The successive approximation analog-to-digital converter has two characteristics in the system: the extremely low power consumption, and the highest driving burden (the larger the sampling capacitor, the greater the amount of charge extracted per sample, and the greater the cost of re-establishing the balance of the drive module) caused by the largest sampling capacitance compared to all other types of analog-to-digital converters (pipeline A/D converter (pipeline-ADC), high-precision A/D converter, flashing A/D converter (FLASH ADC)). Because of these two characteristics, the successive approximation analog-to-digital converter puts forward the following two requirements for its pre-drive module. 1. The programmable gain amplifier module/low noise amplifier module needs to maintain the same low power consumption, otherwise the system cannot maintain the advantage of low power consumption (For example, the total power consumption of the successive approximation analog-to-digital converter and its reference voltage module in the system is 1 mW, the power consumption of the programmable gain amplifier module/low noise amplifier module must be at least less than 5 mW and the smaller the better, otherwise the low power consumption advantage of the successive approximation analog-to-digital converter will not be reflected). 2. The programmable gain amplifier module/low noise amplifier module needs a strong enough driving capability to drive the sampling capacitor of the successive approximation analog-to-digital converter. The low power consumption and high drive capability bring great challenges to the design of the front-end circuit module of the analog-to-digital converter (the higher the accuracy, the larger the sampling capacitance required by the successive approximation analog-to-digital converter, which will further increase the difficulty of designing the programmable gain amplifier module/low noise amplifier module). In addition to optimizing the design, there is often only a compromise between performance (such as linearity, sampling time) and power consumption.

As shown in FIG. 3, FIG. 3 is a schematic circuit diagram of a pre-drive module of a general analog-to-digital converter, which is mainly composed of 4 modules: a front-end drive module (the power consumption can be represented by Idriver at this time, which is usually the largest source of power consumption in the entire system), a sampling switch, a sampling capacitor Cs, and a reset module. The working timing sequence of the existing analog-to-digital converter has four stages: sampling, holding, quantizing, and encoding. The working timing sequence of the analog-to-digital converter is as follows.

The first is reset, which means the reset of the sampling capacitor (also the capacitor of the digital-to-analog converter (DAC)) in the successive approximation analog-to-digital converter, and this process usually only takes up a very small time of the entire conversion cycle. The next is sampling, which represents the sampling process of the successive approximation analog-to-digital converter. Due to the characteristics of the successive approximation analog-to-digital converter, this step completes the sampling and holding phases at the same time, and usually takes up a relatively more time of the entire conversion cycle. The last is analog-to-digital conversion, which represents the conversion process of the successive approximation analog-to-digital converter. This step completes two stages of conversion and encoding, and usually takes up the most time of the entire conversion cycle.

The linearity of the drive circuit is quantified by SFDR/dB. SFDR is Spurious-free dynamic range, which usually indicates the harmonic suppression capability of the system. The second and third harmonics are the main limiting factors of SFDR. For high-precision analog-to-digital converters (12 bits), SFDR often needs to be greater than 75 dB, and for ultra-high-precision analog-to-digital converters (16 bits), SFDR often needs to be greater than 100 dB. The power consumption of the output stage of the drive circuit (Idriver), sampling time (SAMP), and sampling capacitance (Cs) are applicable to the following general formula: Linearity∝20*log 10(Cs*exp−(SAMP/τ)/Idriver). When the design performance of the programmable gain amplifier module/low noise amplifier module reaches the limit, in order to get higher linearity, it is necessary to reduce the value of Cs, increase the time of SAMP/decrease the RC time constant τ of the drive module, or increase the current of Idriver. Generally speaking, the value of Cs is determined by other factors of the successive approximation analog-to-digital converter, and the cost of reducing Cs is extremely high. However, due to the negative exponential relationship of SAMP/τ, only an order of magnitude increase will bring about a significant linearity improvement, which will seriously affect the speed of the analog-to-digital converter. The usual practice is to increase Idriver. 2 times Idriver can generally increase linearity by 6 dB. 10 times the price of Idriver need to be paid to improve the linearity by 20 dB. However, Idriver is the largest component of the total power consumption of the entire system, which is often much larger than the power consumption of the successive approximation analog-to-digital converter itself. Increasing Idriver by 10 times almost increases the maximum power consumption of the entire system. The limitation of the pre-drive of the analog-to-digital converter has become one of the limitations of the overall system performance.

SUMMARY

The main purpose of the present disclosure is to provide a pre-drive module of an analog-to-digital converter, which aims to solve the technical problem of high-power consumption when the pre-drive module of the analog-to-digital converter drives the analog-to-digital converter in the prior art to improve the detection accuracy.

In order to achieve the above objective, the present disclosure provides a pre-drive module of an analog-to-digital converter, including: a sampling capacitor; a controller configured to output a reset control signal, a pre-sampling control signal, and a sampling control signal according to a preset timing sequence; a reset module configured to reset the sampling capacitor upon receiving the reset control signal; a first auxiliary drive circuit configured to amplify an input analog signal and output the amplified input analog signal to the sampling capacitor for sampling upon receiving the sample control signal; and a second auxiliary drive circuit; wherein the controller is configured to output the pre-sampling control signal before outputting the sampling control signal, control the second auxiliary drive circuit to amplify the input analog signal, and output the amplified input analog signal to the sampling capacitor for pre-sampling, and when a charging voltage of the sampling capacitor during pre-sampling reaches a preset voltage value, the controller is configured to output the sampling control signal.

In some embodiments, the controller includes a reset control signal output terminal, a pre-sampling control output terminal and a sampling control signal output terminal; the reset module includes a first terminal, a second terminal and a controlled terminal; the reset control signal output terminal of the controller is connected to the controlled terminal of the reset module; the pre-sampling control output terminal of the controller is connected to a controlled terminal of the second auxiliary drive circuit; the sampling control signal output terminal of the controller is connected to a controlled terminal of the first auxiliary drive circuit; an input terminal of the first auxiliary drive circuit is connected to an input terminal of the second auxiliary drive circuit, and a connection node is an analog signal input terminal; an output terminal of the first auxiliary drive circuit, an output terminal of the second auxiliary drive circuit, a first terminal of the sampling capacitor, and the first terminal of the reset module are connected; and the second terminal of the reset module is connected to an input terminal of the analog-to-digital converter.

In some embodiments, the first auxiliary drive circuit includes a first programmable gain amplifier and a first electronic switch; an input pin of the first programmable gain amplifier is the input terminal of the first auxiliary drive circuit; an output pin of the first programmable gain amplifier is connected to a first terminal of the first electronic switch; a ground pin of the first programmable gain amplifier is grounded; a controlled terminal of the first electronic switch is the controlled terminal of the first auxiliary drive circuit; and a second terminal of the first electronic switch is the output terminal of the first auxiliary drive circuit.

In some embodiments, the second auxiliary drive circuit includes a second programmable gain amplifier and a second electronic switch; an input pin of the second programmable gain amplifier is the input terminal of the second auxiliary drive circuit; an output pin of the second programmable gain amplifier is connected to a second terminal of the first electronic switch; a ground pin of the second programmable gain amplifier is grounded; a controlled terminal of the second electronic switch is the controlled terminal of the second auxiliary drive circuit; and a second terminal of the second electronic switch is the output terminal of the second auxiliary drive circuit.

In some embodiments, the first programmable gain amplifier and the second programmable gain amplifier are non-low-speed high-precision successive approximation analog-to-digital converters.

In some embodiments, the first electronic switch and the second electronic switch are MOS transistors.

In some embodiments, the reset module includes a third electronic switch, a first terminal of the third electronic switch is the first terminal of the reset module, a second terminal of the third electronic switch is the second terminal of the reset module, and a controlled terminal of the third electronic switch is the controlled terminal of the reset module.

In some embodiments, the preset voltage value is 70% to 90% of a voltage of the input analog signal.

In order to achieve the above objective, the present disclosure further provides an analog-to-digital conversion device, including an analog-to-digital converter and the pre-drive module of the analog-to-digital converter as described above and a second terminal of a reset module of the pre-drive module of the analog-to-digital converter is connected to an input terminal of the analog-to-digital converter.

In some embodiments, the analog-to-digital conversion device further includes a digital signal processor, an input terminal of the digital signal processor being connected to an output terminal of the analog-to-digital converter.

The present disclosure provides a pre-drive module of an analog-to-digital converter, including: a sampling capacitor; a controller configured to output a reset control signal, a pre-sampling control signal, and a sampling control signal according to a preset timing sequence; a reset module configured to reset the sampling capacitor upon receiving the reset control signal; a first auxiliary drive circuit configured to amplify an input analog signal and output the amplified input analog signal to the sampling capacitor for sampling upon receiving the sample control signal; and a second auxiliary drive circuit; wherein the controller is configured to output the pre-sampling control signal before outputting the sampling control signal, control the second auxiliary drive circuit to amplify the input analog signal, and output the amplified input analog signal to the sampling capacitor for pre-sampling, and when a charging voltage of the sampling capacitor during pre-sampling reaches a preset voltage value, the controller is configured to output the sampling control signal. Since the second auxiliary drive circuit is added to the original system, the control sampling capacitor pre-samples the analog signal input to the system before the formal sampling, such that the sampling capacitor does not have to extract too much charge in the system during formal sampling, thereby reducing the power consumption of the analog-to-digital converter. At this time, even if the detection accuracy of the analog-to-digital converter is increased, that is, the capacity of the sampling capacitor is increased, there is no need to increase the power consumption of a multiple of the accuracy as the cost, and pre-sampling is performed on the basis of adding the second auxiliary drive circuit to achieve the objective, and the power consumption has only increased by 15% to 25%, therefore, the power consumption of the analog-to-digital converter and the pre-drive module of the analog-to-digital converter is greatly reduced.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

Figure 1:
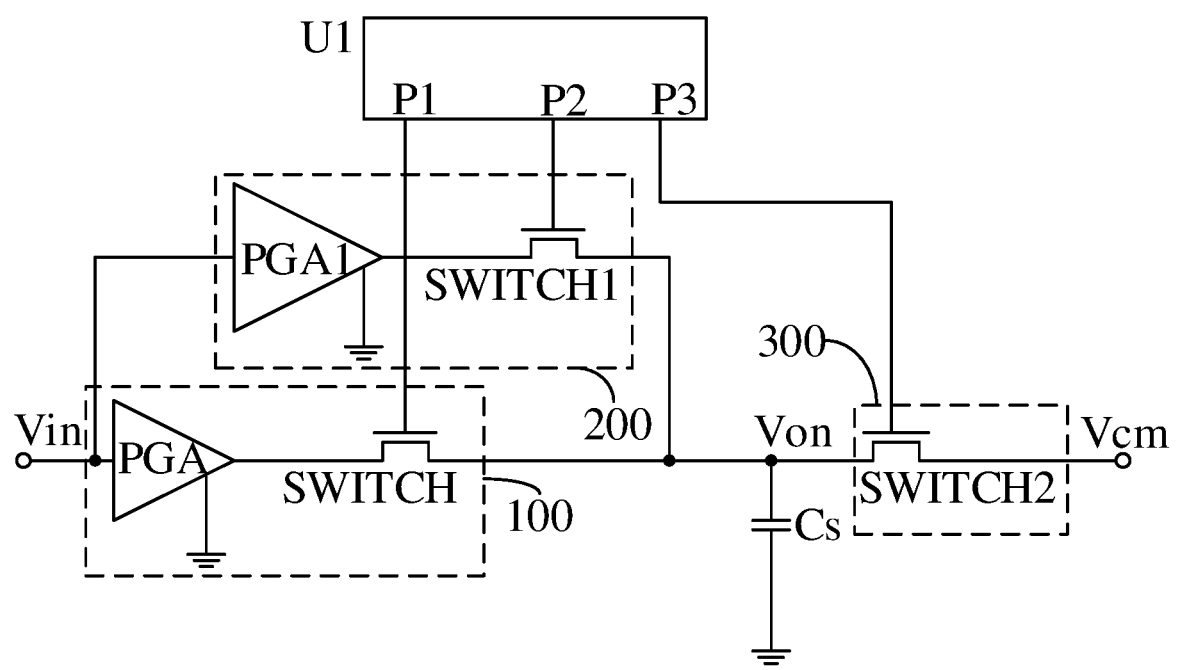
FIG. 1 is a schematic circuit diagram of a pre-drive module of an analog-to-digital converter of the present disclosure.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

It should be noted that, the descriptions associated with, e.g., "first" and "second," in the present disclosure are merely for descriptive purposes and cannot be understood as indicating or suggesting relative importance or impliedly indicating the number of the indicated technical feature. Therefore, the feature associated with "first" or "second" can expressly or impliedly include at least one such feature. In addition, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides a pre-drive module of an analog-to-digital converter, which aims to solve the technical problem of high-power consumption when the pre-drive module of the analog-to-digital converter drives the analog-to-digital converter in the related art to improve the detection accuracy.

In the exemplary technology, the mechanism by which the sampling process of the analog-to-digital converter affects the linearity of the drive circuit lies in the instantaneous charge extraction or injection during sampling (for the convenience of description, all the following use extraction), which will be described in detail below.

Figure 2:
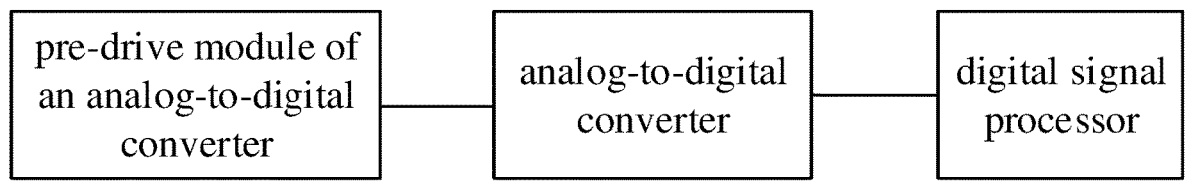
FIG. 2 is a schematic diagram of modules of an analog-to-digital conversion device of the present disclosure.
Figure 3:
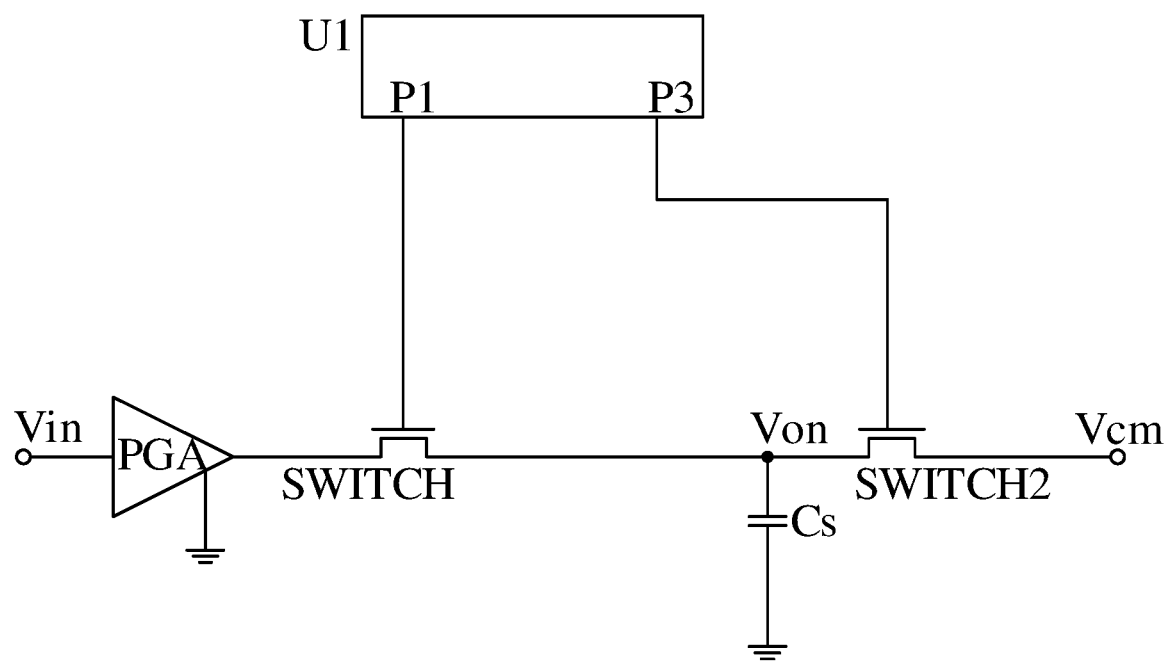
FIG. 3 is a schematic circuit diagram of a pre-drive module of an analog-to-digital converter in the related art.

Firstly, the non-linear effects and charge injection effects caused by all switches are ignored, and the switches are regarded as ideal switches (in fact, the influence of the switches can be reduced to not affect the overall performance through a good design, mainly a fully differential system design and voltage bootstrapping technology), and a simplified model (a gain of the programmable gain amplifier module/low noise amplifier module is equal to 1, an offset is equal to 0, a phase delay is equal to 0) is used to describe the entire sampling process. As shown in FIG. 2, after the sampling capacitor Cs is reset, the charge stored in the sampling capacitor Cs is Vcm*Q, Vcm is a differential common mode voltage, and Q represents a capacitance of the sampling capacitor Cs. From the beginning of the sampling to the end of the sampling, the charge stored in the sampling capacitor Cs is (Vin−E)*Q, and E represents a sampling error, that is, an output error of the drive module. For the N-bit analog-to-digital converter (ADC) system, the sampling error needs to be less than ½N (except for the common mode error, the gain error is an effective error remaining except the linear error), therefore, the charge extracted by the sampling capacitor Cs to the programmable gain amplifier module/low noise amplifier module is [Vcm−(Vin−E)]*Q=(Vcm−Vin)*Q. The high-precision analog-to-digital converter is a fully differential system, Vcm can be ignored as a fixed common modulus, and finally the charge of Vin*Q is sampled and extracted, then the impact of this process on the front-end drive module can be described as follows. During the time of SAMP, the charge X=Vin*Q extracted by the programmable gain amplifier module/low noise amplifier module causes the output error of E. Under the condition of keeping Cs, SAMP/τ and Idriver unchanged, it is logically understood that E∝|X|. When there is an error related to the absolute value of the signal, this error will cause the appearance of the second harmonic, even the third, fourth, and fifth harmonics. All similar systems have the same characteristics: when the input signal is close to the full-scale input, the greater the amplitude of the input signal, the greater the harmonic energy (mainly the energy of the second and third harmonics), and the worse the harmonic suppression capability.

In an embodiment of the present disclosure, as shown in FIG. 1, the pre-drive module of the analog-to-digital converter includes a sampling capacitor Cs, a controller U1, a reset module 300, a first auxiliary drive circuit 100 and a second auxiliary drive circuit 200. The controller U1 successively outputs a reset control signal, a pre-sampling control signal, and a sampling control signal according to a preset timing sequence. Upon receiving the reset control signal, the reset module 300 resets the sampling capacitor Cs. Upon receiving the sampling control signal, the first auxiliary drive circuit 100 amplifies the input analog signal, and outputs the amplified input analog signal to the sampling capacitor Cs for sampling.

The controller U1 outputs the pre-sampling control signal before outputting the sampling control signal, controls the second auxiliary drive circuit 200 to amplify the input analog signal, and then outputs the amplified input analog signal to the sampling capacitor Cs for pre-sampling. When the charging voltage of the sampling capacitor Cs during pre-sampling reaches a preset voltage value, the controller U1 outputs the sampling control signal. Since the second auxiliary drive circuit 200 is added to the original system, the control sampling capacitor Cs pre-samples the analog signal input to the system before the formal sampling, such that the sampling capacitor Cs does not have to extract too much charge in the system during formal sampling, thereby reducing the power consumption of the analog-to-digital converter. At this time, even if the detection accuracy of the analog-to-digital converter is increased, that is, the capacity of the sampling capacitor Cs is increased, there is no need to increase the power consumption of a multiple of the accuracy as the cost, and pre-sampling is performed on the basis of adding the second auxiliary drive circuit 200 to achieve the objective, and the power consumption has only increased by 15% to 25%, therefore, the power consumption of the analog-to-digital converter and the pre-drive module of the analog-to-digital converter is greatly reduced.

In order to achieve the above solutions, in this embodiment, a specific circuit is proposed. The controller U1 includes a reset control signal output terminal P3, a pre-sampling control output terminal P2, and a sampling control signal output terminal P1. The reset module 300 includes a first terminal, a second terminal and a controlled terminal. The reset control signal output terminal P3 of the controller U1 is connected to the controlled terminal of the reset module 300. The pre-sampling control output terminal P2 of the controller U1 is connected to the controlled terminal of the second auxiliary drive circuit 200. The sampling control signal output terminal P1 of the controller U1 is connected to the controlled terminal of the first auxiliary drive circuit 100. The input terminal of the first auxiliary drive circuit 100 is connected to the input terminal of the second auxiliary drive circuit 200, and the connection node is an analog signal input terminal. The output terminal of the first auxiliary drive circuit 100, the output terminal of the second auxiliary drive circuit 200, the first terminal of the sampling capacitor Cs, and the first terminal of the reset module 300 are connected. The second terminal of the reset module 300 is connected to the input terminal of the analog-to-digital converter.

In some embodiments, the first auxiliary drive circuit 100 includes a first programmable gain amplifier PGA and a first electronic switch SWITCH. An input pin of the first programmable gain amplifier PGA is the input terminal of the first auxiliary drive circuit 100. An output pin of the first programmable gain amplifier PGA is connected to the first terminal of the first electronic switch SWITCH, and a ground pin of the first programmable gain amplifier PGA is grounded. A controlled terminal of the first electronic switch SWITCH is the controlled terminal of the first auxiliary drive circuit 100, and a second terminal of the first electronic switch SWITCH is the output terminal of the first auxiliary drive circuit 100.

The first electronic switch SWITCH is turned on under the action of the sampling control signal, and the first programmable gain amplifier PGA works when the first electronic switch SWITCH is turned on, which facilitates control of conduction, and can control turning on and turning off in time. In addition, the cost of the first electronic switch SWITCH is small, and the volume is small, which is convenient for integration.

In some embodiments, the second auxiliary drive circuit 200 includes a second programmable gain amplifier PGA1 and a second electronic switch SWITCH1. An input pin of the second programmable gain amplifier PGA1 is the input terminal of the second auxiliary drive circuit 200. An output pin of the second programmable gain amplifier PGA1 is connected to a second terminal of the second electronic switch SWITCH1. A ground pin of the second programmable gain amplifier PGA1 is grounded. A controlled terminal of the second electronic switch SWITCH1 is the controlled terminal of the second auxiliary drive circuit 200. A second terminal of the second electronic switch SWITCH1 is the output terminal of the second auxiliary drive circuit 200.

The second electronic switch SWITCH1 is turned on under the action of the pre-sampling control signal, and the second programmable gain amplifier PGA1 works when the second electronic switch SWITCH1 is turned on, which facilitates control of conduction, and can control turning on and turning off in time, such that the pre-sampling time can be precisely controlled. In addition, the cost of the second electronic switch SWITCH1 is small, and the volume is small, which is convenient for integration. Compared with directly increasing the power consumption of the programmable gain amplifier, the cost is smaller and the effect is better. Moreover, due to the reduced power consumption, the heat dissipation problem caused by directly increasing the power consumption can also be avoided, further reducing the cost.

In some embodiments, the first programmable gain amplifier PGA and the second programmable gain amplifier PGA1 are non-low-speed high-precision successive approximation analog-to-digital converters.

Since the sampling capacitor Cs in the pre-drive module containing the non-low-speed and high-precision successive approximation analog-to-digital converter is the biggest power consumer, the effect of reducing power consumption is more obvious.

In some embodiments, the first electronic switch SWITCH and the second electronic switch SWITCH1 are MOS transistors. The controlled terminal of the first electronic switch SWITCH and the controlled terminal of the second electronic switch SWITCH1 are gates of the MOS transistors. The first terminal of the first electronic switch SWITCH and the first terminal of the second electronic switch SWITCH1 are drains of the MOS transistors. The second terminal of the first electronic switch SWITCH and the second terminal of the second electronic switch SWITCH1 are sources of the MOS transistors.

The source and the drain of each MOS transistor can be exchanged with each other. That is, the first terminal of the first electronic switch SWITCH and the first terminal of the second electronic switch SWITCH1 can also be the sources of the MOS transistors. The second terminal of the first electronic switch SWITCH and the second terminal of the second electronic switch SWITCH1 can also be the drains of the MOS transistors. When the first electronic switch SWITCH and the second electronic switch SWITCH1 are MOS transistors, they can be turned on and off through high and low voltage levels. Moreover, the response speed of the MOS transistor is faster than that of the triode, so the pre-sampling time can be controlled more accurately. The pre-sampling time at this time is determined by the capacity of the sampling capacitor Cs and the amount of charge sampled for pre-sampling. Generally, the voltage required for sampling is 70% to 90% of the analog signal voltage, which can fluctuate up and down. At this time, the pre-sampling time is about 15% to 25% of the sampling time, and the sampling time is the time required to sample the sampling capacitor Cs that has not been pre-sampled.

In some embodiments, the reset module 300 includes a third electronic switch SWITCH2. A first terminal of the third electronic switch SWITCH2 is the first terminal of the reset module 300. A second terminal of the third electronic switch SWITCH2 is the second terminal of the reset module

300. A controlled terminal of the third electronic switch SWITCH2 is the controlled terminal of the reset module 300.

The third electronic switch SWITCH2 is turned on and off by the reset control signal, and is reset during each pre-sampling, so that the sampling result is more accurate.

In some embodiments, the preset voltage value is 70% to 90% of the input analog signal voltage Vin.

When the preset voltage value is 70% to 90% of the analog signal voltage Vin, the pre-sampling time is about 15% to 25% of the sampling time. When increasing the same detection accuracy, the power consumption will only increase by about 15% to 25% of the original power consumption, instead of increasing by several times of the original power consumption, thereby, improving the detection accuracy of the analog-to-digital converter, reducing the power consumption, and preventing the entire auxiliary drive architecture from being affected by overheating caused by excessive power consumption.

The following describes the technical principles of the present disclosure with reference to FIG. 1 and FIG. 2.

In the present disclosure, the second auxiliary drive circuit 200 is a mirror image of the first auxiliary drive circuit 100. As the programmable gain amplifier module/low noise amplifier module is generally multi-stage amplification (usually two stages, and in a few cases, three stages), the second auxiliary drive circuit 200 is only the mirror image of the last stage, that is, the driver stage (output stage), not the mirror image of the entire programmable gain amplifier module/low noise amplifier module. In this way, it is ensured that the output of the second auxiliary drive circuit 200 and the output of the first auxiliary drive circuit 100 have the same phase and the same swing, that is, Vin1(t) ≈Vin(t) (the error of about 3% caused by the mismatch is acceptable and easy to achieve), and the power consumption and area of the second auxiliary drive circuit 200 are minimized.

Thus, compared with the traditional structure, a pre-sampling timing sequence is inserted between a reset timing sequence and a sampling timing sequence, and its time is about 15% to 25% of the sampling timing sequence. Meanwhile, the first auxiliary drive circuit 100 and the corresponding second electronic switch SWITCH1 are added. The size of the second auxiliary drive circuit 200 is about 15% to 25% of the first auxiliary drive circuit 100, therefore, the power consumption Idriver1 of the second auxiliary drive circuit 200 is also about 15% to 25% of the power consumption Idriver of the first auxiliary drive circuit 100. It should be noted that the purpose of the auxiliary drive stage is not to help the sampling capacitor Cs to be established but to absorb the main part of the charge extraction or injection, because the linearity output by the second auxiliary drive circuit 200 does not directly affect the linearity of the sampling signal (this is also the reason for broadening Idriver1). However, since the first auxiliary drive circuit 100 only takes on a small part of the charge extraction or injection, the output accuracy (that is, the sampling accuracy) of the drive stage that exceeds 75 dB SFDR (12 bitsADC) or 100 dB SFDR (16 bitsADC) can be maintained at a small cost at the end of the sampling (sampling signal Von=Vin(sampling end time)−E). As a supplementary explanation, the output error E of the first auxiliary drive circuit 100 has a negative exponential relationship with time. That is to say, it takes much less time and cost to go from 100% to 10% than from 10% to 0.001%. Therefore, about 20% of Idriver and 20% of SAMP are generally sufficient for auxiliary drive modules. Before the next sampling starts, the second auxiliary drive circuit 200 has had a long enough time (SAMP+SAR OPERATION>>SAMP1) to restore balance. Even though there might still be an error, E, at the end of the sampling, the described approach minimizes the correlation of the error and the input signal. This reduces the power stored in the harmonic tones. As a result, the SFDR improves with the penalty of some increase in the noise floor.

The output stage of the programmable gain amplifier module/low noise amplifier module (about 15% to 25% additional area and 15% to 25% additional power consumption) is mirrored as an additional auxiliary drive module (shown in the figures as PGA1). However, the sampling capacitor Cs needs an additional pre-sampling, that is, the sampling capacitor Cs is set up from Vcm to about 70% to 90% Vin in advance. Therefore, at the beginning of the complete sampling, the sampling capacitor Cs only needs to start sampling from about 70% to 90% Vin. In this way, the charge extraction of the main drive circuit and the first auxiliary drive circuit 100 can be reduced by an order of magnitude, thereby reducing the sampling error E by an order of magnitude, and a performance improvement close to 20 dB SFDR can be obtained. The cost is only an additional auxiliary drive module (the area and power consumption of the second auxiliary drive circuit 200 is much smaller than that of the first auxiliary drive circuit 100) and additional sampling time (SAMP1, about 15% to 25% SAMP). As for the additional sampling switch, the cost of the switch itself can be negligibly small compared to the entire system. Increasing the 20 dB SFDR in the traditional structure requires the cost of increasing the power consumption of Idriver by 10 times, but the present disclosure can greatly reduce power consumption while improving the same detection accuracy.

In order to solve the technical problem of high-power consumption when the analog-to-digital converter improves the detection accuracy in the related art, the present disclosure also provides an analog-to-digital conversion device, as shown in FIG. 2, including an analog-to-digital converter and a pre-drive module of the analog-to-digital converter. The output terminal of the reset module 300 of the pre-drive module of the analog-to-digital converter is connected to the input terminal of the analog-to-digital converter.

It is worth noting that, since the analog-to-digital conversion device of the present disclosure includes all the embodiments of the pre-drive module of the above-mentioned analog-to-digital converter, the analog-to-digital conversion device of the present disclosure has all the beneficial effects of the pre-drive module of the above-mentioned analog-to-digital converter, which will not be repeated here.

In some embodiments, the analog-to-digital conversion device further includes a digital signal processor, and the input terminal of the digital signal processor is connected to the output terminal of the analog-to-digital converter.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A pre-drive module of an analog-to-digital converter, comprising:
a sampling capacitor;

a controller configured to output a reset control signal, a pre-sampling control signal, and a sampling control signal according to a preset timing sequence;

a reset module configured to reset the sampling capacitor upon receiving the reset control signal;

a first auxiliary drive circuit configured to amplify an input analog signal and output the amplified input analog signal to the sampling capacitor for sampling upon receiving the sample control signal; and a second auxiliary drive circuit;

wherein the controller is configured to output the pre-sampling control signal before outputting the sampling control signal, control the second auxiliary drive circuit to amplify the input analog signal, and output the amplified input analog signal to the sampling capacitor for pre-sampling, and, the controller is further configured to output the sampling control signal when a charging voltage of the sampling capacitor during pre-sampling reaches a preset voltage value.

2. The pre-drive module of the analog-to-digital converter of claim 1, wherein:

the controller comprises a reset control signal output terminal, a pre-sampling control output terminal and a sampling control signal output terminal;

the reset module comprises a first terminal, a second terminal and a controlled terminal;

the reset control signal output terminal of the controller is connected to the controlled terminal of the reset module;

the pre-sampling control output terminal of the controller is connected to a controlled terminal of the second auxiliary drive circuit;

the sampling control signal output terminal of the controller is connected to a controlled terminal of the first auxiliary drive circuit;

an input terminal of the first auxiliary drive circuit is connected to an input terminal of the second auxiliary drive circuit, and a connection node is an analog signal input terminal;

an output terminal of the first auxiliary drive circuit, an output terminal of the second auxiliary drive circuit, a first terminal of the sampling capacitor, and the first terminal of the reset module are connected; and the second terminal of the reset module is connected to an input terminal of the analog-to-digital converter.

3. The pre-drive module of the analog-to-digital converter of claim 2, wherein:

the first auxiliary drive circuit comprises a first programmable gain amplifier and a first electronic switch;

an input pin of the first programmable gain amplifier is the input terminal of the first auxiliary drive circuit;

an output pin of the first programmable gain amplifier is connected to a first terminal of the first electronic switch;

a ground pin of the first programmable gain amplifier is grounded;

a controlled terminal of the first electronic switch is the controlled terminal of the first auxiliary drive circuit; and a second terminal of the first electronic switch is the output terminal of the first auxiliary drive circuit.

4. The pre-drive module of the analog-to-digital converter of claim 3, wherein:

the second auxiliary drive circuit comprises a second programmable gain amplifier and a second electronic switch;

an input pin of the second programmable gain amplifier is the input terminal of the second auxiliary drive circuit;

an output pin of the second programmable gain amplifier is connected to a second terminal of the first electronic switch;

a ground pin of the second programmable gain amplifier is grounded;

a controlled terminal of the second electronic switch is the controlled terminal of the second auxiliary drive circuit; and a second terminal of the second electronic switch is the output terminal of the second auxiliary drive circuit.

5. The pre-drive module of the analog-to-digital converter of claim 4, wherein the first programmable gain amplifier and the second programmable gain amplifier are non-low-speed high-precision successive approximation analog-to-digital converters.

6. The pre-drive module of the analog-to-digital converter of claim 4, wherein the first electronic switch and the second electronic switch are MOS transistors.

7. The pre-drive module of the analog-to-digital converter of claim 2, wherein the reset module comprises a third electronic switch, a first terminal of the third electronic switch is the first terminal of the reset module, a second terminal of the third electronic switch is the second terminal of the reset module, and a controlled terminal of the third electronic switch is the controlled terminal of the reset module.

8. The pre-drive module of the analog-to-digital converter of claim 1, wherein the preset voltage value is 70% to 90% of a voltage of the input analog signal.

9. An analog-to-digital conversion device, comprising an analog-to-digital converter and the pre-drive module of the analog-to-digital converter of claim 1, wherein a second terminal of a reset module of the pre-drive module of the analog-to-digital converter is connected to an input terminal of the analog-to-digital converter.

10. The analog-to-digital conversion device of claim 9, further comprising a digital signal processor, wherein an input terminal of the digital signal processor is connected to an output terminal of the analog-to-digital converter.

* * * * *